United States Patent [19]
Nichols

[11] Patent Number: 4,910,920
[45] Date of Patent: Mar. 27, 1990

[54] ELECTROMAGNETIC DOOR SEAL

[75] Inventor: Frederick J. Nichols, Los Angeles, Calif.

[73] Assignee: LectroMagnetics, Inc., Los Angeles, Calif.

[21] Appl. No.: 283,027

[22] Filed: Dec. 9, 1988

Related U.S. Application Data

[63] Continuation of Ser. No. 164,518, Mar. 7, 1988, abandoned, which is a continuation of Ser. No. 925,613, Oct. 31, 1986, abandoned.

[51] Int. Cl.$^4$ ............................................... E06B 7/16
[52] U.S. Cl. .............................. 49/485; 174/35 MS; 49/495
[58] Field of Search ............... 49/383, 403, 485, 495; 174/35 MS; 219/10.55 D

[56] References Cited

U.S. PATENT DOCUMENTS

| | | | |
|---|---|---|---|
| 4,046,618 | 1/1978 | Geiss | 174/35 MS |
| 4,046,983 | 9/1977 | Ishino et al. | 174/35 MS |
| 4,069,618 | 1/1978 | Geiss | 49/483 |
| 4,677,251 | 6/1987 | Merewether | 174/35 MS |

Primary Examiner—Kenneth J. Dorner
Assistant Examiner—Gerald A. Anderson
Attorney, Agent, or Firm—William H. Pavitt, Jr.; Daniel L. Dawes; Ralf H. Siegemund

[57] ABSTRACT

Reliable repeatable electromagnetic sealing between a door and jamb is accomplished across a broad band of frequencies without dependence upon closure pressure between the door and jamb by combining conductive resilient finger stock with electromagnetically absorbing material in alternating parallel peripheral strips along the door and jamb interface. The electromagnetically absorbing material is characterized by optimal energy absorption at frequencies higher than a predetermined frequency whereas the conductive resilient finger stock is characterized by optimal electromagnetic attenuation at frequencies lower than the same predetermined frequency. As a result, a broad band attenuating seal is provided between the door and jamb characterized throughout the frequency spectrum by high attenuation and without critical dependence upon the pressure or nature of contact of the finger stock against the conductive opposing surface of the jamb.

4 Claims, 2 Drawing Sheets

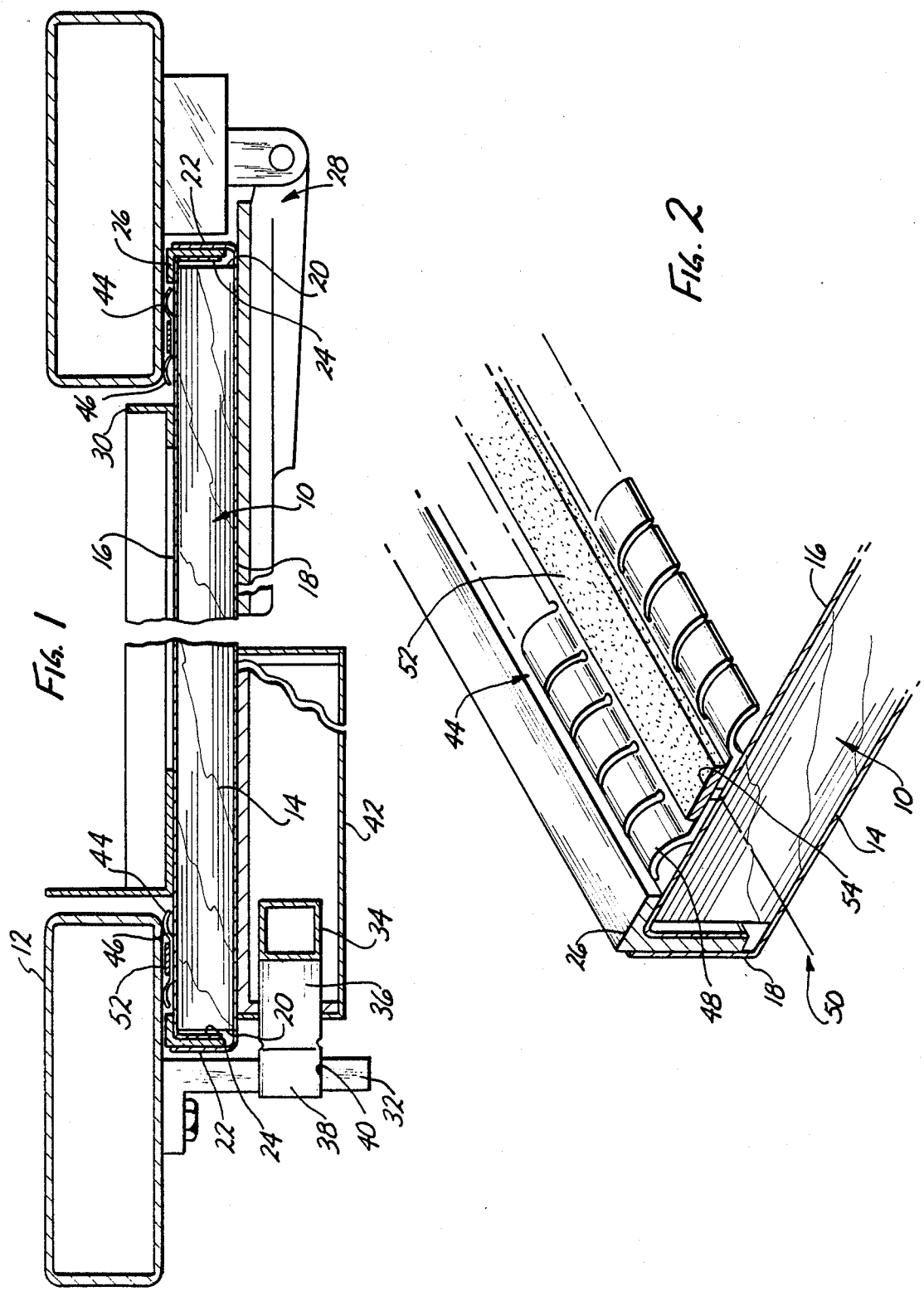

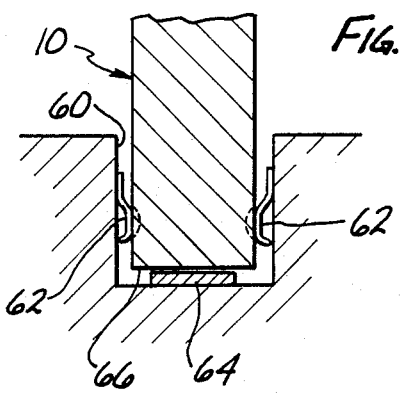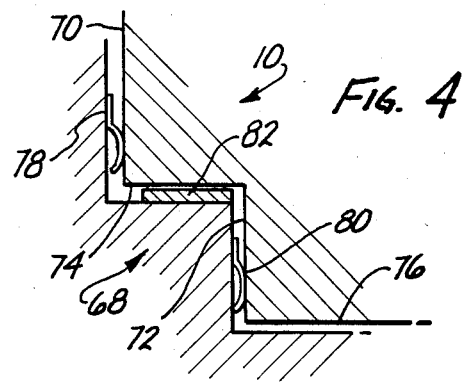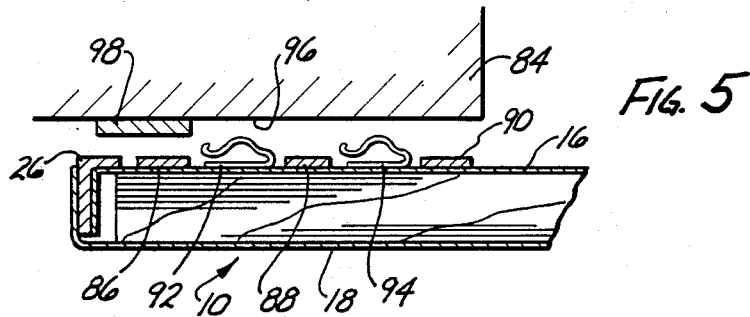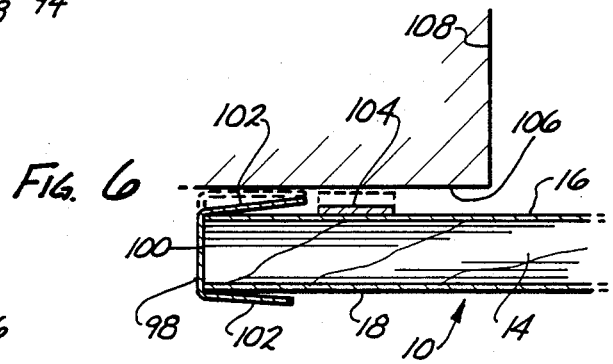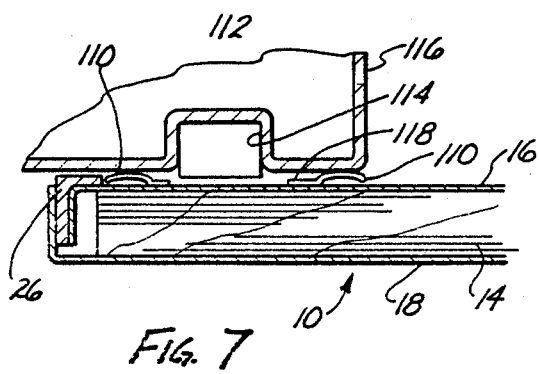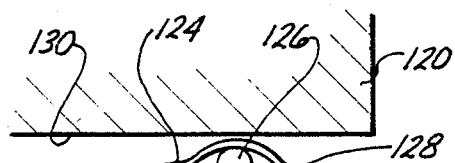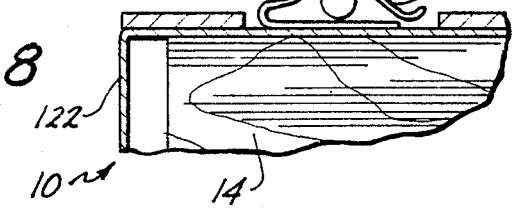

ELECTROMAGNETIC DOOR SEAL

This is a continuation of co-pending application Ser. No. 164,518 filed on Mar. 7, 1988, now abandoned, which is a continuation of application Ser. No. 925,613 filed Oct. 31, 1986, now abandoned.

BACKGROUND OF THE INVENTION

1. Field of the Invention

The present invention relates to the field of electromagnetic door gaskets and in particular to electromagnetic door seals capable of providing extremely high electromagnetic attenuation over a wide frequency band.

2. Description of the Prior Art

Faraday cages, or electromagnetically shielded rooms have become common and widespread furnishings in manufacturing, research and development facilities throughout the world. Heretofore and continuing to the present day, many of these rooms are manufactured by the user and simply consist of a conductive lining attached to the interior walls, floor and ceiling of the room, such as stapled or nailed metallic screening or sheet. The door or other means of access to the room is similarly lined with a metallic screen to allow user access and then electromagnetic sealing by a simple and conventional mechanical door closure. However, the degree of attenuation provided by casually user-made screened rooms is unacceptable for many applications. In many cases, instrumentation which is being tested within such enclosures is extremely sensitive and erroneous test results will be realized unless there is an overall electromagnetic attenuation, at least 100 db. Cracks within screening joints, thermal expansion between the walls, ceiling and floor, or failure to make metal-to-metal contact around the door seal or any other imperfection in the conductivity easily results in electromagnetic leakages into such rooms which renders the performance of such rooms highly ineffective or entirely useless.

The difficulty of high levels of electromagnetic attenuation, namely 100 db or higher, is even more greatly exacerbated when the room must be shielded not only for a specified domain of frequencies, but must provide a high degree of electromagnetic attentuation over a wide range of frequencies, such as a minimum of 100 db from 10 kHz to 44 GHz. Even in the case of professionally constructed enclosures with carefully designed metal-to-metal contact seals about the door closure, this degree of electromagnetic attenuation across a broad band of frequencies becomes extremely difficult, if not impossible.

Typically, such door seals have included a border of resilient electromagnetic fingers between the door and door jamb which provide for metal-to-metal contact. Examples of such finger stock is illustrated in U.S. Pat. Nos. 3,504,095; 2,825,042; 3,437,735; 3,304,360; 2,783,295; 4,039,741; 3,904,810; and 3,594,490. Generally such seals have been comprised of a length of curved resilient finger stock mated in contact with an opposing flat conductive surface. The degree of attenuation which is provided at various frequencies depends upon the nature and construction of the finger stock, the pressure of metal-to-metal contact achieved, and the overall design of the seal configuration. Performance results are difficult to repeat, and as a practical matter with current designs of seals, the achievement of repeatable sealings is a mystical art.

A single layer of finger stock in contact with an opposing metallic wall has often been found, even under the best of circumstances, to be inadequate. For this reason, the prior art has devised a number of labyrinthian designs such as shown in U.S. Pat. Nos. 3,055,969; 3,589,070; and 4,069,618. Even though the use of labyrinthian designs incorporating multiple stages of finger stock and other metallic separating elements has improved performance, the ability to obtain repeatable sealing pressures has affected the repeatability and reliability of the attenuation.

In a further attempt to solve the problems pertaining to the unreliability of the contact pressures, the prior art has devised labyrinthian seals which include means for resiliently determining the contact pressure of closure such as shown in U.S. Pat. No. 3,296,356.

However, the greater the complexity of the electromagnetic labyrinth which is incorporated into the design, the greater the expense and difficulty of manufacturing. Therefore, in a further attempt to increase electromagnetic seal perfection, the prior art has devised the use of expanded metal to form two-dimensional gasket seals with a multiplicity of contact points between adjacent conductive surfaces, such as shown in U.S. Pat. No. 3,206,536.

Although each of these prior art steps has served to increase electromagnetic seal perfection to a degree, effective attenuation by metallic contact seals have typically been limited to specific frequency spectrums. Normally, such metallic finger stock type seals of any design are effective at the lower frequencies. At higher frequencies, the wavelengths are orders of magnitude smaller and labyrinthian seals of the even the most complex and intricate design appear to the electromagnetic radiation as wide gaping holes in the door seal. To avoid this difficulty, and to avoid the problems inherent in contact pressure, the prior art has devised various noncontact types of seals such as shown in U.S. Pat. Nos. 4,399,316 and 4,514,425, or as used microwave absorbing material from which to fabricate the seal gaskets as shown in U.S. Pat. No. 4,046,983. However, electromagnetically absorptive materials are similarly inherently limited by the frequency dependence of their coefficients of absorption only to the higher frequencies. While such microwave absorbers effectively serve to block or absorb energy in the microwave spectrum and higher, they appear to be translucent or even transparent at the lower frequency radiation.

Therefore, what is needed in some type of electromagnetic absorber which is capable of providing effective and high degrees of energy attenuation from long wave length frequencies ranges to shorter microwave ranges without being subject to the limitations and defects of the prior art.

BRIEF SUMMARY OF THE INVENTION

The present invention is in its most abstract characterization an electromagnetic attenuating seal disposed between a first and second element comprising first mechanism and a second mechanism. The first mechanism is for attenuating lower frequency electromagnetic radiation. The first mechanism is disposed between the first and second elements. The second mechanism is for attentuating higher frequency electromagnetic radiation. The second mechanism is disposed between the first and second elements and is adjacent to the first mechanism. The first and second mechanism coact to attenuate electromagnetic radiation across a broad band of frequencies.

The first mechanism is metallic finger stock, the second mechanism is an electromagnetic absorbing substance, and the first and second elements incorporate a conductive surface at least on that portion in contact with the first mechanism. The first and second elements include a conductive surface in contact with the second mechanism. The first element includes a plurality of spaced apart conductive finger stock strips and the second mechanism is a flat strip of electromagnetically absorbing material diposed at least between two of the plurality of conductive strips.

The absorbing strip is arranged and configured and dimensioned so that operation of the finger strip causes the finger strip to be compressed between the first and second elements. Compression of the finger strip is limited by interference with the absorbing strip disposed within the space defined within the finger strip.

In another embodiment the second mechanism comprises a strip of electromagnetically absorbing material. The strip is disposed on one of the first and second elements. Operation of the seal disposes the absorbing strip adjacent the other one of the first and second elements. The absorbing strip is disposed within the other one of the first and second elements by a distance no greater than a predetermined distance.

The seal in some embodiments further comprises a spacer for reliably adjusting the distance of separation between the first and second elements. The second mechanism comprises an electromagnetically absorbing strip disposed between the first and second elements, and is attached to one of the first and second elements and spaced apart from the other one of the first and second elements by no more than a predetermined distance. The spacer, together with dimensions of the absorbing strip, reliably determine the predetermined distance.

In a somewhat more specific characterization of the invention, the invention is an electromagnetic door seal for attenuating electromagnetic radiation between a jamb and a door. The door is arranged and configured to assume a closed configuration with respect to the jamb. The seal comprises at least one strip of a plurality of resilient and conductive fingers or leaves disposed on the door and extending from the door toward the jamb when the door is in the closed configuration. The conductive fingers provide electrical contact between the jamb and the door. The jamb and door is provided with conductive surfaces at least on that portion of that the door and jamb in the vicinity of the conductive fingers. An electromagnetically absorbing strip is adjacent to the plurality of conductive fingers. The material of the electromagnetic absorbing strip is characterized by optimal absorption of electromagnetic radiation at frequencies above a predetermined frequency. The plurality of conductive fingers in contact between the door and jamb is characterized by optimal electromagnetic radiation below the predetermined frequency. By reason of this combination of elements a reliable, broad band, high attenuating electromagnetic seal is provided which is substantially independent of contact pressure between the conductive fingers, door and jamb.

The electromagnetically absorbing strip is characterized by a dimension extending between the door and jamb less than the dimension of the conductive fingers in the same direction when the door is in the closed configuration. The magnitude of the difference in the dimension between the absorbing strip and the conductive fingers when the door is in the closed configuration does not exceed a predetermined magnitude.

The invention can also be characterized as a method for electromagnetically sealing a door against a jamb comprising the steps of atttentuating electromagnetic radiation between the jamb and door with a plurality of conductive resilient fingers in contact with the door and jamb. The door and jamb includes at least a conductive surface at that portion of the conductive fingers. The method includes the step of absorbing electromagnetic radiation adjacent to the plurality of conductive fingers with an adjacent strip of electromagnetically absorbing material. The absorbing material is disposed across a gap between the door and jamb and defines an open gap between the electromagnetic material and the door and jamb by a distance not greater than a predetermined magnitude.

The method further comprising the steps of repetitively attenuating and absorbing electromagnetic energy through a plurality of alternating strips of conductive fingers and electromagnetically absorbing material.

BRIEF DESCRIPTION OF THE DRAWINGS

FIG. 1 is a fragmentary cross-sectional view of a door, door jamb and door seal incorporating the invention.

FIG. 2 is an enlarged perspective view of a portion of the door seal shown in FIG. 1.

FIG. 3 is a diagrammatic cross-sectional view of a second embodiment of a door seal incorporating the invention.

FIG. 4 is a diagrammatic sectional view of a third embodiment of a door seal incorporating the invention.

FIG. 5 is a diagrammatic cross-sectional framentary view of a door, door jamb and door seal of a fourth embodiment incorporating the invention.

FIG. 6 is a fragmentary cross-sectional diagrammatic view of a fifth embodiment of a door seal incorporating the invention.

FIG. 7 is a fragmentary diagrammatic cross-sectional view of a sixth embodiment of a door seal incorporating the invention.

FIG. 8 is a fragmentary cross-sectional diagrammatic view of a seventh embodiment of a door seal incorporating the invention.

The invention and its various embodiments are better understood by turning now to the following detailed description wherein like elements are referenced by like numerals.

DETAILED DESCRIPTION OF THE PREFERRED EMBODIMENTS

The invention is an electromagnetic seal used, for example, in door closures, capable of a high attenuation, broad band frequency performance and relative independence of contact of closure pressure. In one embodiment of the invention, the closure seal is comprised of a combination of a microwave absorber with a plurality of metallic elements for establishing metal-to-metal contact between the adjacent surfaces which are to be electromagnetically sealed. The metallic elements are arranged and configured to provide a substantial metallic barrier across the closure space between, for example, a door and door jamb, to thereby attenuate the lower electromagnetic frequencies. Adjacent or proximate to the metallic elements is an electromagnetically absorbing element particularly characterized by its volume absorption of electromagnetic energy at the higher frequencies. The electromagnetically absorbing element is not necessarily in contact with an adjacent conducting or absorbing surface or element, but preferably extends across the closure space to within a predetermined gap of an opposing conductive surface.

Surprisingly, the combination of the metallic element and electromagnetically absorbing element provide electromagnetic attentuation across a broad band of frequencies without dependence upon contact pressure exerted on the metallic element by the opposing conductive surface as long as the electromagnetically absorbing element is disposed within a predetermined distance from a conductive surface on the opposing side of the closure space. The invention and its various embodiments, together with its mode of operation can better be understood by now first turning to the embodiment illustrated in FIGS. 1 and 2.

Turning to FIG. 1, a door, generally denoted by reference numeral 10 is shown in juxtaposition to a metallic door frame 12. FIG. 1 shows a fragmented cross-sectional view wherein door 10 is shown as closed against jamb 12. Door 10, in the illustrated embodiment, is shown as having a core 14. In the illustration, core 14 is made of wood or a laminate of wood. In general core 14 may be made of any convenient construction material or even left hollow. Core 14 in turn is clad on its front and rear sides with metallic sheeting 16 and 18 respectively. The rear sheeting 18 extends across the entire rear surface of core 14 and extends laterally outward beyond the side edges 20 of core 14 to form a forwardly projecting side 22. Similarly, front sheeting 16 extends across the entire front surface of core 14 to edge 20 of the core and similarly is bent to form a rearwardly extending side 24. In the illustrated embodiment, side 24 is nested within side 22. Sides 24 and 22 in turn are connected to each other by a metallic angle iron 26 which is disposed about the entire periphery of door 10 between sides 22 and 24. Angle 26, as shown in FIG. 1, has an L-shaped cross section with a long leg in contact with sides 22 and 24 and disposed therebetween, and a shorter horizontal leg at approximately right angles thereto which is disposed inwardly and on top of forward sheeting 16. Angle iron 26 can be spot-welded, soldered, brazed, press-fit or otherwise disposed or attached to sheetings 16 and 18 to form a completed metallic enclosure about core 14 and to further provide rigidity and strenghtening to the periphery of door 10.

Door 10 is coupled to the right side of jamb 12 in the illustration of FIG. 1 by means of a plurality of conventional swing hinges generally denoted by reference numeral 28. One of such hinges 28 is shown in partial fragmentary and cross-sectional view in FIG. 1. Typically, hinge 28 is through-bolted (not shown) to both door 10 and jam 12. Furthermore, front sheeting 16 of door 10 is further reinforced by means of a zinc-plated angle contact guard 30 which serves to provide the main structural rigidity to door 10.

Door 10 is sealed against jamb 12 by means of a conventional latching mechanism, a portion of which is shown in cross-sectional view on the left rear portion of FIG. 1. A plurality of rigid brackets 32 are through-bolted to jamb 12. Although not completely illustrated in the embodiment and not structurally forming part of the invention, a portion of the means which creates pressure of the door 10 against jamb 12 is illustrated in cross-sectional view in FIG. 1. The means which produces the door pressure includes a vertical bar 34 which runs the substantial vertical length of the door 10 on its left side, as shown in FIG. 1. At a plurality of points, in particular three, bar 34 includes a horizontal projection 36 which is terminated by a roller 38. Roller 38 is arranged and configured to be disposable within an inclined slot 40 defined in bracket 32. Bar 34 is therefore vertically displaceable by a lever latch mechanism (not shown) attached to bar 34 at the mid portion of the door, or at handle height. When the lever is actuated, bar 34 is vertically displaced so as to draw roller 38 downwardly in the inclined slot 40 defined within bracket 32 thereby forcing door 10 against jamb 12. Bar 34 and projection 36 are retained within a slotted housing 42. Many other equivalent means, such as inflation bladders and the like, could be employed to create a pressure to urge door 10 against jamb 12. In any case, the pressure which urges door 10 aganist jamb 12 is dependent upon the force and degree to which roller 38 is forced downwardly within inwardly inclined slot 40. Therefore, the pressure will to some extent vary within a range between one door closure and another depending upon user variations, as well as fatique an aging of the door structure.

As door 10 is urged against jamb 12 a plurality of finger stock elements 44 is brought into contact with an opposing metallic surface 46 on jamb 12. Finger stocks 44 in the embodiments of FIGS. 1 and 2 include a plurality of resilient curvalinear leaves 48 symmetrically extending from a midline 50. Disposed on misline 50 of finger-stock 44 is an electromagnetic absorbing strip 52.

The sealing mechanism in the embodiment of FIG. 1 is better seen in enlarged perspective view in FIG. 2. FIG. 2 shows the sealing mechanism apart from its cooperation with the opposing metallic surface 46 of jamb 12. In the preferred embodiment absorbing strip 52 is comprised of a ferromagnetic electromagnetically or microwave absorbing material, well known to the art, and finger stock 44 is conventionally available bilaterally symmetric spring metal. As shown in the cross-sectional view of FIG. 1, when door 10 is closed, finger stock 44 is in contact with the opposing surface 46 of jamb 12 while a small predetermined clearance between jamb 12 and absorbing material 52 is permitted. When door 10 is closed and finger stock 44 is in contact with jamb 12, the forward most surface 54 of absorbing material 52 and opposing surface 46 ideally should be touching although gaps which are fractional parts of a wavelength might be tolerated in some applications.

With the combination as described, the amount of pressure exerted by finger stock 44 against opposing surface 46 and the degree of contact made therewith is substantially less critical than if absorbing material 52 were absent. In other words, the lower frequencies within at about 10 kHz acceptable electromagnetic attenuation can be achieved by finger stock 44 without substantial dependence upon the contact pressure or perfection of electrical contact between surface 46 and finger stock 44. On the other hand, above approximately 1 GHz a substantial part of electromagnetic energy is absorbed by absorbing strip 52, which is independent of contact pressure. The only extent to which absorption or attenuation by strip 52 depends upon the perfection of door closure is the gap or compression between strip 52 and the opposing jamb. The maximum permissible gap will depend in large part upon the frequency band absorbed by the material of strip 52. For example, if strip 52 is designed to have a maximum attenuation at 1 GHz and higher, in particular in the range of 1 to 44 GHz with possible extensions to 300-400 GHz the elements of the seal should be in contact with each other.

The attenuation which can be achieved by finger stock 44 and absorbing strip 52 can be varied according to well known design principles. According to the present invention, the optimum frequency absorption of fingers 44 is matched to complement the optimum range of frequency absorption of absorbing strip 52 to provide a broad band absorption by combination of the two. The closure of the seal is designed to draw surface 54 of absorbing strip 52 within at least a predetermined gap distance from the opposing conducting surface 46 of jamb 12 to insure, that in the high frequency band which absorption by strip 52 is highest, acceptable attenuation is achieved. Only the force necessary to bring the gap, if any, within this predetermined range is necessary in order to optimize operation of the invention. Therefore, to a large extent the pressure dependence between finger stock 44 and jamb 12 is eliminated. The particular clearances will depend upon the frequencies and degress of attenuation which are sought as well as upon the design of the particular finger stock and absorbing material, all of which can be varied within a range of parameters.

Specifically, finger stock of the type shown in FIG. 2 is manufactured as finger stock model 97-500 by Instrument Specialty Company, Inc. of Little Falls, N.J., while absorbing material 52 is comprised of ferrite loaded-silicon rubber or polyurethane as manufactured by Plessey or AEMI of San Diego, Calif.

Turn now to the diagrammatic partial cross-sectional view of a second embodiment of the invention as illustrated in FIG. 3. The door, again referenced by numeral 10 in the second embodiment of the invention in FIG. 3, is shown diagrammatically in cross-sectional view as a sliding door. The core, sheathing, reinforcing and other details of the door structure have been omitted for the sake of simplicity. However, it should be understood that door 10 incorporates an outer conductive surface. Sliding door 10 of FIG. 3 is disposed within a door jamb slot 60. Slot 60 includes two vertical sides and a generally perpendicular horizontal side. As with door 10, door jamb slot 60 also includes an outer conductive surface. Each of the vertical sides of jamb slot 60 includes along with links, a roll of finger stock 62 attached thereto. Finger stock 62 is a conventional contacting RF seal similar to finger stock 44 as depicted in FIG. 2. When non-compressed, finger stock 62 assumes an extended shape as suggested by the dotted outline in FIG. 3. However, when door 10 is disposed within jamb 60, finger stock 62 is compressed by contact with the outer surface of door 10 and assumes the configuration shown in solid outline. The horizontal surface of jamb slot 60 includes an electromagnetically absorbing strip 64 similar to absorbing strip 52 described in connection with the embodiment of FIGS. 1 and 2. Again it is not necessary that absorbing strip 64 contact the butt end 66 of door 10. A small gap of predetermined distance may exist between end 66 and the adjacent surfaces of strip 64. The width of strip 64 and its proximity to the adjacent finger stock strip 62 can be varied to optimize the combined electromagnetic attenuating effect of the seal comprised of finger stock 62, and strip 64, in combination with the configuration of door 10 and jamb slot 60 consistent with the principles as described above in connection with the embodiment of FIGS. 1 and 2 according to the frequency responses of finger stock 62 relative to strip 64 in the configuration of FIG. 3. In other words, according to the invention it is expected that not only the inherent RF attenuation characteristics of strip 64 and finger stock 62 are relevant parameters for the determination of broad band electromagnetic attenuation, but that also the configuration of finger stock strip 62 in combination with strip 64 is a relevant parameter as well. For example, in the first embodiment of FIGS. 1 and 2, the seal was made with respect to a swinging door which brought two flat surfaces in juxtaposition to each other. On the other hand, in the embodiment of FIG. 3 a sliding door incorporating a door jamb slot 60 which forms a U-shaped labyrinth is contemplated. The physical juxtaposition of elements 62 and 64 is also a parameter relevant to the electromagnetic attenuation achievable across a broad band spectrum. The mechanism by which the door closure is achieved thus affects and sometimes limits the extent to which elements 62 and 64 can be relatively disposed.

Turn now to the third embodiment of FIG. 4, wherein a portion of door 10 is shown in diagrammatic cross-sectional view in a closed position with respect to a mating jamb generally denoted by reference numeral 68. In the third embodiment, door 10 and jamb 68 each forms a labyrinthian surface comprised of vertical and horizontal steps. More specifically, door 10 includes an alternating series of vertical surfaces 70 and 72 with horizontal surfaces 74 and 76. Opposing and corresponding vertical and horizontal surfaces are also defined within jamb 68. As before, the outer surface of door 10 and jamb 68 are each provided with a conductive layer or are inherently conductive. The vertical surface of jamb 68 opposing surface 70 of door 10 is similarly provided with a strip of conductive resilient finger stock 78. Similarly, the vertical surface of jamb 68 opposing surface 72 is similarly provided with a strip of finger stock 80. Between finger stock strips 78 and 80 an electromagnetically absorbing strip 82 is provided on the horizontal surface of jamb 68 opposing surface 74 of door 10. Again, strip 82 need not make contact with surface 74, but a gap of a maximum predetermined width is allowed therebetween. Finger stock strip 78 and 80 on the other hand make contact and are pressed against the surfaces 70 and 72 respectively of door 10.

Again it should be understood that the particular electromagnetic attenuation characteristics of strips 78, 80 and 82 can be varied among each other in a fashion differing even from the second embodiment of FIG. 3 due to the distinct labyrinthian passageway formed by the alternating horizontal and vertical steps of surfaces 72-76. Furthermore, although the embodiment of FIG. 4 has assumed that strips 78, 80 and 82 are attached to jamb 68, the electromagnetic seal could as well be conceived as characterizing the door as element 68 and the jamb as element 10. Which element may be the door jamb is largely arbitrary in many configurations, although it is generally assumed that the jamb is stationary while the door moves.

In the embodiment of FIG. 4, for the purpose of the invention which of the elements 10 or 68 is stationary or moves can be arbitrarily interchanged. Similarly, strips 78, 80 and 82 could be reversed and attached to door 10 rather than jamb 68 if desired, although attachment of elements 78-82 to the stationary jamb is preferred in order to obtain electromagnetic seals having an attenuation performance which is reliably repeatable. More-over, door 10 of FIG. 4 may be considered as either a swinging or sliding door although the labyrinthian design as shown in FIG. 4 is preferably used in swinging doors.

FIG. 5 is a diagrammatic cross-sectional view of yet a fourth embodiment of the invention wherein a door 10 similar in design to that shown in connection with FIG. 1 utilizes a compound electromagnetic seal in a swinging door. More specifically, the forward surface 16 of door 10 is provided with a plurality of absorbing strips 86-90 alternated between a corresponding plurality of resilient conductive finger stock strips 92-94. On the opposing surface 96 of jamb 84 an absorbing strip 98 is also provided. In the embodiment of FIG. 5, door 10 is shown in a partially open configuration. When closed, finger stock strips 92 and 94 are compressed and in contact with opposing surface 96. Again jamb 84 includes a conductive outer surface. Meanwhile, absorbing strip 86 is in contact with or nearly in contact with opposing absorbing strip 98. The abutment or near abutment of strips 98 and 86 serve as a spacing element to control the degree of compression and therefore contact force of resilient finger stock strips 92 and 94 as well as the gap between absorbing strips 88 and 90 and opposing connective surfaces 96. Therefore, while the configuration of FIG. 5 provides a simple swinging door with two opposing flat surfaces, the electromagnetic sealing means of the invention provides a compound and controllably reproduceable elecromagnetic sealing configuration between jamb 84 and door 10.

FIG. 6 is a diagrammatic cross-sectional view of a fifth embodiment to the invention wherein door 10 includes a core 14, rear surface 18 and inner surface 16 as before, but is covered on its end surface 98 by a U-shaped conductive channel 100. Sheeting 16 and 18 extend across the front and rear surfaces of core 14 into U-shaped channel 100. Channel 100 is, however, is not perfectly U-shaped and is more exactly described as a truncated V-shape. As illustrated in FIG. 6 in exaggerated scale in solid outline, channel 100 includes two inclined arms 102 which diverge away from sheeting 16 and 18 thereby providing a V-shaped space along the edge of door 10. Adjacent the inner one of arms 102 is an absorbing strip 104 attached to forward sheeting 16. When door 10 is closed, strip 104 and inner arm 102 assume the configuration as shown in dotted outline in FIG. 6. Arm 102 is in contact with opposing surface 106 of jamb 108 and may be bent slightly inward by the force of contact. Similarly, absorbing strip 104 is brought into closer proximity to opposing surface 106 and may be in contact therewith or defines a gap from surface 106 no greater than a predetermined magnitude.

In each of the embodiments described above conductive finger stock and electromagnetically absorbing strips were combined to form a composite electromagnetic seal by being attached to the same element, namely either to the door jamb or to the door. Turn now to FIG. 7 wherein a sixth embodiment of the invention is illustrated in diagrammatic cross-sectional view wherein these elements are disposed oppositely, namely finger stock 110 is attached to forward sheeting 16 of door 10 while absorbing strip 112 is disposed within a mating groove 114 formed or defined in jamb 116. Door 10 in the embodiment of FIG. 7 is constructed substantially in the same manner as described with respect to the embodiment of FIGS. 1 and 2. However, jamb 116 includes a peripheral channel 114 in which an electmagnetically absorbing peripheral strip 112 is disposed. Door 10 is again illustrated in the configuration of FIG. 7 as a swinging door which is shown in a closed position. Finger stock 110 is compressed and in contact with opposing conducting surfaces of jamb 116. Absorbing strip 112, which may be substantially thicker than the absorbing strips shown in the previously described embodiments, extends from channel 114 beyond opposing surface 118 of jamb 116 to extend within front sheeting 16 of door 10 to at least within a predetermined distance. Again, strip 112 may in fact be in contact with sheeting 16, but according to the invention such contact is unnecessary as long as the gap between the outermost adjacent surface of strip 112 and sheeting 16 does not exceed a predetermined maximum for optimal performance. Should the predetermined maximum be exceeded, electromagnetic attenuation will nevertheless still occur at a somewhat reduced efficacy depending upon frequency.

FIG. 8 illustrates a cross-sectional diagrammatic view of a seventh embodiment of the invention wherein jamb 120 is electromagnetically sealed with respect to door 10. In the embodiment of FIG. 8 door 10 is shown in fragmentary view as including a core 14 in an exterior conductive sheeting 122. Attached to sheeting 122 is as strip of conductive and resilient finger stock 124 similary to that previously described. Finger stock 124 includes therein a strip of electromagnetically absorbing material 126. Strip 126 in the embodiment of FIG. 8 is disposed inside of finger stock 124, that is, is disposed in rope or cord form in the enclosed or semi-enclosed space 128 defined by the bent finger stock 124. Absorbing strip 126 is resilient or at least crushable to some degree so that when finger stock 124 is in contact with the opposing surface 130 of jamb 120 the degree of compression of finger stock 124 is limited at least in part by the partial resistance to compression of electromagnetically absorbing strip 126. Furthermore, strip 126 serves as an electromagnetically attenuating element in the exposed gaps defined by finger stock 124, which gaps are better illustrated in the first embodiment of FIG. 2. Thereby, the bottom to FIG. 8 illustrated an integral electromagnetic attenuating strip which provides some degree of controllability of compression and force of contact when the sealing elements are brought into contact between adjacent surfaces of jamb 120 and door 10.

It should be clearly understood that the illustrated embodiments as set forth above are described only for the purposes of example and are not intended to limit the invention which is defined in the following claims. Many modifications and alterations may be made to the illustrated embodiments without departing from the spirit and scope of the invention as defined by the claims.

I claim:

1. An electromagnetic attenuating seal disposed between a first element defined by a door and a second element defined by a jamb, said first and second elements having a closed configuration and an open configuration, comprising:

conductive contact means for attenuating a predetermined low frequency bandwidth range, said conductive contact means including at least a pair of metallic strips electrically coupled one to the other, at least one of said pairs of metallic strips each having a portion defined by a plurality of resilient curved leaves, said pair of metallic strips being disposed between and on one of said first and second elements for electrically coupling said first and second elements; and partially conductive absorber means for attenuating a predetermined high frequency bandwidth range, said partially conductive absorber means including a strip of electromagnetically absorbing material disposed between said pair of metallic strips and on one of said first and second elements, whereby said conductive means and said absorber means coact to attenuate electromagnetic radiation across a bandwidth incorporating a summation of said low and high frequency bandwidth ranges substantially independent of contact pressure exerted on said plurality of resilient curved leaves and said first and second elements, wherein said strip of electromagnetically absorbing material is mounted on one of said first and second elements and wherein closing of said seal locationally displaces said absorbing strip adjacent the other one of said first and second elements, said absorbing strip being disposed when said first and second elements are configured in said closed configuration adjacent said other one of said first and second elements by a distance no greater than a fractional portion of a wavelength of the shortest wavelength of electromagnetic radiation to be attenuated 60 db or more by said seal.

2. An electromagnetic attenuating seal disposed between a first element defined by a door and a second element defined by a jamb, said first and second elements having a closed configuration and an open configuration, comprising:

conductive contact means for attenuating a predetermined low frequency bandwidth range, said conductive contact means including at least a pair of metallic strips electrically coupled one to the other, at least one of said pairs of metallic strips each having a portion defined by a plurality of resilient curved leaves, said pair of metallic strips being disposed between and on one of said first and second elements for electrically coupling said first and second elements;

partially conductive absorber means for attenuating a predetermined high frequency bandwidth range, said partially conductive absorber means including a strip of electromagnetically absorbing material disposed between said pair of metallic strips and on one of said first and second elements, whereby said conductive means and said absorber means coact to attenuate electromagnetic radiation across a bandwidth incorporating a summation of said low and high frequency bandwidth ranges substantially independent of contact pressure exerted on said plurality of resilient curved leaves and said first and second elements; and spacer means for reliably adjusting the distance of separation between said first and second elements, said spacer means comprising an electromagnetically absorbing strip for attenuating electromagnetic radiation in said high frequency bandwidth, said strip disposed between and on one of said first and second elements, attached to one of said first and second elements opposite said absorber means and spaced apart from the opposing one of said first and second elements by no more than a predetermined distance defined by a fractional portion of a wavelength of the shortest wavelength of electromagnetic radiation to be attenuated 60 db or more by said seal when said first and second elements are in said closed configuration.

3. An electromagnetic door seal for attenuating electromagnetic radiation between a jamb and a door, said door arranged and configured to assume a closed configuration with respect to said jamb, said seal comprising:

at least two metallic strips each having a plurality of resilient and conductive leaves disposed on said door and extending from said door toward said jamb when said door is in said closed configuration, said conductive leaves providing electrical contact between said jamb and said door, said jamb and door being provided with conductive surfaces at least in that portion of that said door and jamb in the vicinity of said conductive leaves; and an electromagnetically absorbing strip disposed between said two strips of conductive leaves, the material of said electromagnetically absorbing strip for providing substantial absorption of electromagnetic radiation at frequencies above a predetermined frequency, said plurality of conductive leaves in contact between said door and jamb for providing substantial attenuation of electromagnetic radiation below said predetermined frequency, said absorbing strip being disposed on either said door or said jamb and spaced a distance from the other of said door or jamb no treater than a fractional portion of a wavelength of the shortest wavelength of electromagnetic radiation to be attenuated 60 db or more by said door seal, whereby a reliable, broad band, high attenuating electromagnetic seal is provided which is substantially independent of contact pressure between said conductive leaves, door and jamb.

4. The seal of claim 3 wherein said electromagnetically absorbing strip is characterized by a dimension extending between said door and jamb less than the dimension of said conductive leaves in the same direction when said door is in said closed configuration, the magnitude of said difference in said dimension between said absorbing strip and said conductive leaves when the door is in said closed configuration not exceeding a fractional portion of a wavelength of the shortest wavelength of electromagnetic radiation to be attenuated more than 100 db by said door seal.

* * * * *